United States Patent [19]

Ogita et al.

[11] 4,356,568

[45] Oct. 26, 1982

[54] RECEPTIVE CONDITION AUTOMATIC SELECTION DEVICE FOR FM RECEIVER

[75] Inventors: Minoru Ogita; Naobumi Kimura, both of Hamamatsu, Japan

[73] Assignee: Nippon Gakki Seizo Kabushiki Kaisha, Japan

[21] Appl. No.: 918,513

[22] Filed: Jun. 23, 1978

[30] Foreign Application Priority Data

Jul. 2, 1977 [JP] Japan .............................. 52-87765[U]

[51] Int. Cl.³ .......................... H04B 1/10; H04B 1/16
[52] U.S. Cl. .................................... 455/212; 455/225; 455/266
[58] Field of Search ............... 455/205, 208, 212, 222, 455/225, 266

[56] References Cited

U.S. PATENT DOCUMENTS

| | | | |
|---|---|---|---|
| 2,927,997 | 3/1960 | Day | 455/266 |
| 2,969,459 | 1/1961 | Hern | 455/266 |
| 4,124,817 | 11/1978 | Takahashi | 455/205 |
| 4,245,348 | 1/1981 | Imazeki | 455/212 |

FOREIGN PATENT DOCUMENTS 50-158209 12/1975 Japan .
52-63311 5/1977 Japan .
52-150636 5/1977 Japan .

Primary Examiner—Jin F. Ng
Attorney, Agent, or Firm—Kane, Dalsimer, Kane, Sullivan and Kurucz

[57] ABSTRACT

A receptive condition automatic selection device for an FM receiver comprises a band width changing circuit for changing a band width of an intermediate-frequency amplifier of the receiver, a first detector for detecting a noise level contained in a demodulation signal from a demodulator, a second detector for detecting a tuning condition of the receiver by the demodulation signal and a bistable circuit connected to said first and second detectors for producing a control signal for the band width changing circuit. The band width of the intermediate-frequency amplifier can be automatically changed to either a narrow band or a wide band in accordance with receptive conditions of the FM receiver.

5 Claims, 3 Drawing Figures

RECEPTIVE CONDITION AUTOMATIC SELECTION DEVICE FOR FM RECEIVER

BACKGROUND OF THE INVENTION

This invention relates to an FM radio receiver in which the frequency band width of an intermediate-frequency amplifier stage, a front end, or the like can be changed automatically.

As is well known in the art, if the band width of an intermediate-frequency amplifier stage or the like in an FM radio receiver is broad, then a low distortion factor is obtained and the right and left channels of an FM stereophonic broadcast signal are satisfactorily separated from each other. Therefore, the FM radio receiver can effect signal reception and reproduction with high fidelity. However, if the band width is broad, the selectivity is decreased. Therefore, if an input signal is weak or a high power near-by station is present, the reproduced audio signal may not be clear because of the interference by noise signals or near-by signals.

In order to overcome this difficulty, a radio receiver has been put to practical use in which the band width of the intermediate-frequency amplifier stage or the like is switched between two kinds of band width or more, and the band width is normally set to the broad band width for signal reception with high fidelity, but it is switched over to the narrow band width for high selectivity when an interference signal exists. An example of a band width switching circuit has been disclosed in U.S. patent application Ser. No. 850,310 filed Nov. 10, 1977, now U.S. Pat. No. 4,178,551 issued Dec. 11, 1979, inventors and a coinventor and assigned to the same assignee as the present application.

However, the conventional receiver of this type is so designed that the band width is changed manually, and therefore it is necessary for a user to infer from the reproduced audio signal what band width is most suitable. In addition, such inference may be achieved by a skilled person, but it is not always possible for an average user to do so, or to receive a signal in most suitable state. Furthermore, the manual band width change is rather troublesome. If the band width is broad, sometimes it is difficult to obtain the correct tuning. Therefore, it is preferable to change the band width to the narrow band width during the station selecting operation. However, it is troublesome to do such a band width changing operation during the station selecting operation.

SUMMARY OF THE INVENTION

Accordingly, an object of this invention is to eliminate all of the above-described difficulties accompanying a conventional FM radio receiver.

More specifically, it is an object of the invention to provide an FM receiver in which a signal receiving band width is automatically switched in accordance with a noise level in the demodulated signal and with a tuning condition of the receiver.

According to one aspect of the invention, an FM radio receiver is provided with a band width switching circuit which is controlled by a flip-flop circuit, and the flip-flop circuit is set so that the band width is changed to a broad band width by a signal from a first detector adapted to detect the level of a noise signal contained in the FM demodulation signal, and is reset by a signal from a second detector adapted to detect the tuning condition of the receiver, whereby the manual switching operation is eliminated, and a suitable band width is automatically obtained according to the signal receiving conditions of the receiver.

The automatic selection circuit is so designed that a differentiation circuit is interposed between the flip-flop circuit and the second detector so that only when the signal receiving condition of the receiver is turned to a tuned state from a detuned state, the flip-flop circuit is set.

The second detector is made up of a DC component detection circuit adapted to detect a DC component contained in the FM demodulation signal to satisfactorily detect the tuning condition by utilization of the "S" curve characteristic of the demodulator.

According to another aspect of the invention, the second detector is made up of a DC component detection circuit and an AND circuit which outputs a signal only when a signal from the DC component detection circuit and a signal from the first detector are applied thereto, so that only when the receiver is tuned and the level of a noise signal is low at the tuning point, the band width is changed over to the broad band width.

The novel feature which are considered as characteristic of this invention are set forth in the appended claims. This invention itself, however, as well as other objects and advantages thereof will be best understood by reference to the following detailed description of illustrative embodiments, when read in conjunction with the accompanying drawings, in which like parts are designated by like reference numerals or characters.

DETAILED DESCRIPTION OF THE INVENTION

Figure 1:
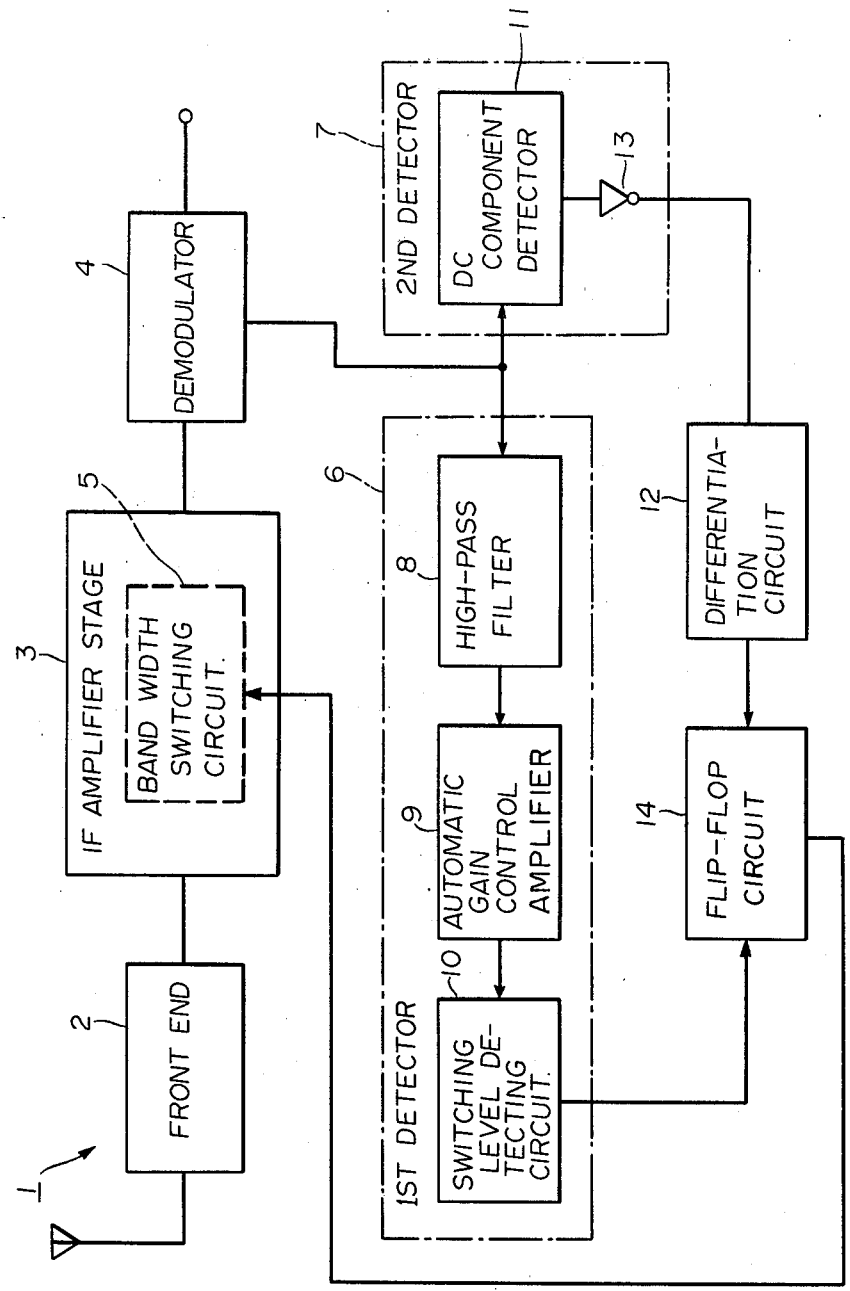
FIG. 1 is a block diagram showing a first embodiment of this invention.

A first embodiment of this invention will be described with reference to FIG. 1.

The signal path of a tuner section 1 is constituted by a front end 2, an intermediate-frequency amplifier stage 3, and a demodulator 4, similar to those in a conventional FM receiver. The intermediate-frequency amplifier stage 3 is provided with a band width switching circuit 5 for switching the frequency band width between a broad band and a narrow band or more. The output of the demodulator 4 is connected to a first detector 6 adapted to detect the level of noise components included in an FM demodulation signal and to a second detector 7 adapted to detect a tuning state by utilizing the "S" curve of the FM demodulation signal. The first detector 6 operates to output a noise detection signal, that is, a reset signal to reset a flip-flop circuit described later when the aforementioned noise level exceeds a predetermined level. The first detector 6 comprises a high-pass filter 8 for passing only the high-frequency components of a demodulation signal from the demodulator 4, an automatic gain control amplifier 9 for automatically controlling the gain in response to the magnitude of the signal passing through the high-pass filter, and a switching level detecting circuit 10 which is controlled by the gain control operation of the automatic gain control amplifier 9. The high-pass filter 8 is to obtain high-frequency noise components above the audio frequency range from the demodulation signal, and therefore in the automatic gain control amplifier 9 the gain is controlled in response to the magnitude of the noise component. In other words, in the automatic gain control amplifier 9, a controlled current such as a collector current DC component of an amplifying transistor (not shown) is decreased in response to the increment of the aforementioned noise component. The switching level detecting circuit 10 operates to output a reset signal when the level of the controlled current becomes lower than a predetermined switching level. In other words, the switching level detecting circuit 10 outputs the reset signal when the noise component exceeds the predetermined level.

When the tuner section 1 is tuned, the second detector 7 detects and outputs a tuning detection signal. The second detector 7 is made up of a DC component detector 11 and an inverter 13 adapted to invert a signal from the DC component detector 11. The DC component detector 11 operates to detect the DC component of the demodulation signal, and to output a signal whose level is raised to a high level when a DC component is included in the demodulation signal (detuned state) and is changed to a low level or a zero level when a DC component is not included therein (tuned state). The output of the detector 11 is inverted by the inverter 13 to be supplied to a differentiation circuit 12.

The output of the switching level detecting circuit 10 of the first detector 6 and the output of the differentiation circuit 12 are connected to a flip-flop circuit 14. The flip-flop circuit 14 forms a control circuit for controlling the band width switching circuit 5 in the intermediate-frequency amplifier stage 3. When a high level signal, namely, a set signal is applied to the flip-flop circuit 14 by the differentiation circuit 12, the flip-flop circuit 14 is set so as to switch the band width switching circuit 5 to the broad band. When a reset signal is applied to the flip-flop circuit 14 by the first detector 6, the flip-flop circuit 14 is reset so as to switch the band width switching circuit 5 to the narrow band.

The operation of the first embodiment thus organized will be described. Under the conditions that a station selecting operation is started but no tuning is obtained yet, that is, in a detuning state, the noise level is high. This noise level is detected by the first detector 16, so that a reset signal is applied to the flip-flop circuit 14. As a result, the flip-flop circuit 14 is reset, and the band width switching circuit 5 is switched to the narrow band. Thus, signal reception is effected with a narrow band characteristic.

When the tuning comes close to the tuning point, in general the noise component included in the demodulation signal is considerably decreased. Therefore, application of the reset signal from the first detector 6 is ceased, whereby the state of the flip-flop circuit 14 is changed to be set. At the tuning point, no DC component is contained in the demodulation signal because of its "S" curve. Therefore, the output level of the second detector 7 is changed from the zero level to the high level. Accordingly, the high level signal, or the set signal, is applied to the flip-flop circuit 14 by the differentiation circuit 12. As a result, the flip-flop circuit 14 is set, and the band width switching circuit 5 is switched to the broad band. Thus, a broad band signal reception is obtained.

If, under the condition that the station selecting operation has been completed to effect the broad band signal reception, the noise and interference signals contained in the demodulation signal are not increased, no reset signal is provided by the first detector 6, and therefore the broad band signal reception is maintained. On the other hand, when the noise and interference signals contained in the demodulation signal are increased as a result of switching the circuit 5 to the broad band, the reset signal is applied to the flip-flop circuit 14 by the first detector 6 again, whereby the flip-flop circuit 14 is reset so that the band width switching circuit 5 is switched to the narrow band. In this case, the noise and interference signals are, in general, reduced. Therefore, the reset signal from the first detector 6 may not be applied to the flip-flop circuit 14 after returning to the narrow band reception. In such a case, if the signal reception state is again switched to the broad band signal reception state due to, for example, the absence of DC component in the demodulation signal, then the noise signal or the like is increased again in the broad band signal reception state, and therefore the signal reception state is returned to the narrow band signal reception state once again, and it becomes difficult to maintain the stable signal reception. However, since the differentiation circuit 12 is interposed between the second detector 7 and the flip-flop circuit 14 in this embodiment, the high level set signal is applied to the flip-flop circuit 14 only when the detuning state is changed to the tuning state, and no set signal is applied thereto when the tuning state is maintained. Therefore, even if, as was described above, the noise signal or the like is reduced to stop the application of the reset signal as a result of switching to the narrow band signal reception from the broad band reception, the flip-flop circuit 14 will not be set again, and therefore the narrow band signal reception state is stably maintained.

Figure 2:
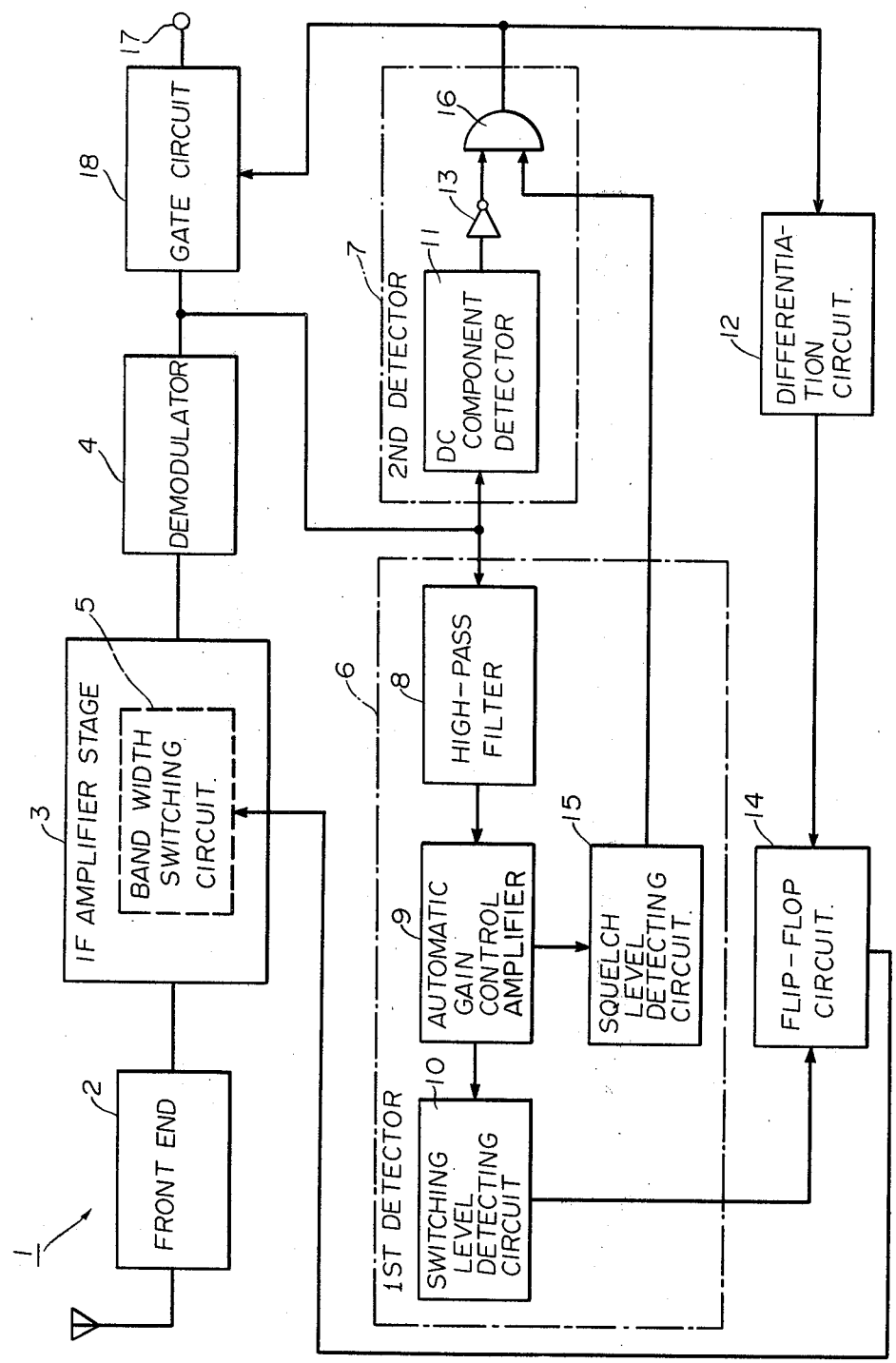
FIG. 2 is also a block diagram showing a second embodiment of the invention.

A second embodiment of the invention is shown in FIG. 2, in which those components which have been previously described with reference to FIG. 1 have been similarly numbered and will not be described in detail.

In the second embodiment, in addition to the above-described switching level detecting circuit 10, a squelch level detecting circuit 15 for producing an output signal when the noise level is below a predetermined level, is connected to the automatic gain control amplifier 9 in the first detector 6. The second detector 7 is provided with an AND circuit 16 which outputs a signal when the DC component detector 11 detects no DC component and the noise level is below the detection level of the circuit 15. The output of the AND circuit 16 is connected to the above-described differentiation circuit 12. The detection noise level of the squelch level detecting circuit 15 is set to be higher than the detection noise level of the switching level detecting circuit 10. For instance, it is so designed that the detecting circuit 10 carries out the detection operation when the S/N ratio of the demodulation signal is less than 50 dB, and that the detecting circuit 15 carries out the detection operation when the S/N ratio is more than 30 dB.

A gate circuit 18 is connected between the output of the demodulator 4 and a tuner output terminal 17, to block the signal from the demodulation circuit 4. The gate circuit 18 is so designed that it is normally closed but it is opened when the output of the AND circuit 16 is applied thereto. The remaining circuit elements are similar to those shown in FIG. 1.

The operation of the embodiment shown in FIG. 2 will be described.

Under the condition that a station selecting operation is started and the tuning is not obtained yet, that is, in a detuning state, similarly as in the first embodiment, the flip-flop circuit 14 is reset by the reset signal from the first detector 6, and therefore the narrow band signal reception state is provided. Then, around the tuning point, the noise component contained in the demodulation signal is reduced to be below the detection level of the circuit 10, as a result of which application of the reset signal is ceased, and the flip-flop circuit 14 is placed in a settable state. When the tuning point is completely obtained, and the noise component is reduced to be below the detection level of the circuit 15, a tuning point detection signal (meaning that the tuning point is obtained) of the DC component detector 11 and a squelch level detection signal (meaning that the noise level is sufficiently low) of the squelch level detecting circuit are applied to the AND circuit 16, and the set signal from the AND circuit is applied through the differentiation circuit 12 to the flip-flop circuit 14 to set the latter 14. As a result, the band width switching circuit 5 is switched to the broad band. Even if the tuning point is completely obtained, when the level of the noise component is higher than the detection level of the switching level detecting circuit 10 a reset signal is still produced from the circuit 10. Hence, the band width switching circuit is not switched to the broad band, and the narrow band signal reception state is maintained. On the other hand, after reaching the tuning point the noise level is increased to be higher than the detection level of the circuit 10 by switching to the broad band reception, the signal reception state is again switched to the narrow band signal reception state by the reset signal from the first detector 6 similarly as in the first embodiment.

In the second embodiment, the gate circuit 18 is normally closed, while it is opened when the signal from the AND circuit 16 is applied thereto, so that the gate circuit 18 is closed when the noise level is higher than the detection level of the circuit 15 and/or when the tuning point is not completely obtained, but it is opened when the tuning point is completely obtained and the noise level is lower than the detection level of the circuit 15. Therefore, only when the noise level is low and when the tuning point is obtained, the FM demodulation signal is delivered to the tuner output terminal 17. However, in the cases other than this the FM demodulation signal is not delivered to the tuner output terminal 17 and a so-called muting state is maintained.

Figure 3:
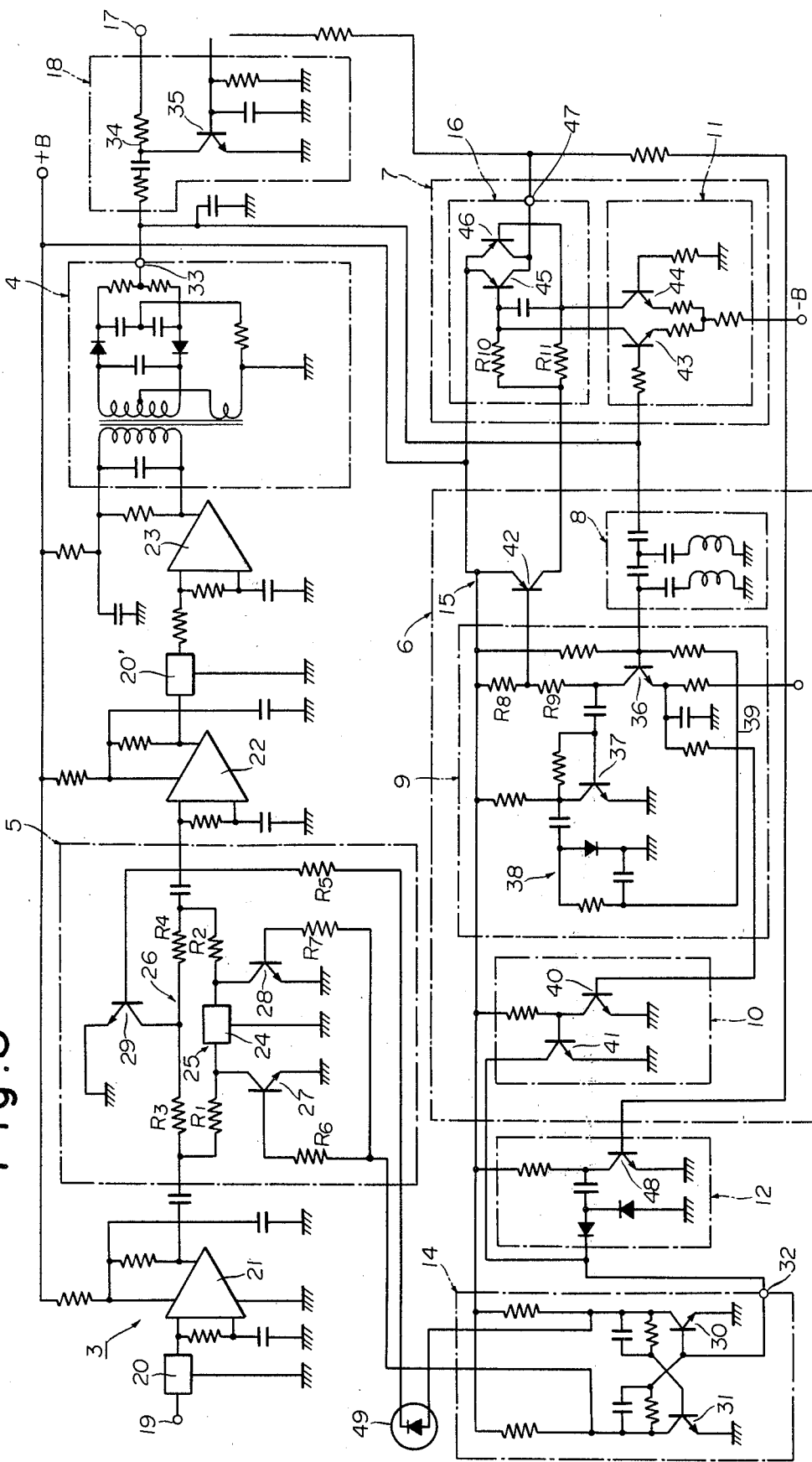
FIG. 3 is a concrete circuit diagram, partly as a block diagram, according to the second embodiment of the invention.

Referring now to FIG. 3 showing a concrete circuit diagram according to the second embodiment of the invention, reference numeral 19 is intended to designate an input terminal 19 to which an intermediate-frequency signal is applied from the front end (not shown). The input terminal 19 is connected to the intermediate-frequency amplifier stage 3 which comprises filters 20 and 20' and amplifiers 21, 22 and 23 and in which the band width switching circuit 5 is interposed between the amplifiers 21 and 22. The band width switching circuit 5 comprises a path 25 formed by a series circuit of a filter 24 and resistors R1 and R2, a path 26 connected in parallel to the path 25 and formed by a series circuit of resistors R3 and R4, a transistor 27 connected between the input terminal of the filter 24 and the ground, a transistor 28 connected between the output terminal of the filter 24 and the ground, and a transistor 29 connected between the connection point of the resistors R3 and R4 in the path 26 and the ground. That is, the band width switching circuit 5 is switched to the broad band when a signal is allowed to pass through the path 26 by rendering the transistors 27 and 28 conductive, while it is switched to the narrow band when a signal is allowed to pass through the path 25 by rendering the transistor 29 conductive. The flip-flop circuit 14 for controlling the band width switching circuit 5 is made up of transistors 30 and 31, and the trigger input terminal 32 thereof is connected to the base of the transistor 30. The collector of the transistor 30 is connected through a resistor R5 to the base of the transistor 29 in the band width switching circuit 5, while the collector of the transistor 31 is connected through resistors R6 and R7 to the bases of the transistors 27 and 28, respectively.

The demodulation signal output terminal 33 of the demodulator 4 provided at the rear stage of the intermediate-frequency amplifier stage 3 is connected through the gate circuit 18 to the tuner output terminal 17. The gate circuit 18 has a transistor 35 connected between the ground and a signal path 34 extended from the demodulation signal output terminal 33 to the tuner output terminal 17. The gate circuit 18 is so designed that when the transistor 35 is rendered conductive, the signal path 34 is grounded to block the transmission of the demodulation signal. The high-pass filter 8 of the first detector 6 connected to the demodulation signal output terminal 33 is constituted by a well-known LC circuit. The automatic gain control amplifier 9 of the first detector 6 comprises a first stage amplification transistor 36, a second stage amplification transistor 37, a rectifier circuit 38 adapted to rectify the output signal of the transistor 37, and a feed-back circuit 39 adapted to feed-back the signal of the rectifier circuit 38 to the base of the transistor 36, so that when the signal from the high-pass filter 8 is increased, the DC collector current of the transistor 36 is decreased. The switching level detecting circuit 10 comprises transistors 40 and 41 in such a manner that the transistor 41 is rendered conductive or non-conductive according to the emitter potential of the transistor 36 in the automatic gain control amplifier 9. The collector of the transistor 41 is connected to the trigger input terminal 32 of the flip-flop circuit 14, and the emitter of the same is grounded. Voltage dividing resistors R8 and R9 are provided in the collector circuit of the transistor 36 of the automatic gain control amplifier 9. The connection point of the resistors R8 and R9 is connected to the base of a transistor 42 forming the squelch level detecting circuit 15.

The DC component detector 11 connected to the demodulation signal output terminal 33 comprises transistors 43 and 44 forming a comparator circuit for comparing the DC voltage of the demodulation signal with the zero potential. The AND circuit 16 is made up of a pair of PNP transistors 45 and 46 connected in parallel. The base of one transistor 45 is connected to the collector of one transistor 43 in the DC component detector 11, while the base of the other transistor 46 is connected to the collector of the other transistor 44 in the DC conponent detector 11. The bases of the transistors 45 and 46 are connected respectively through resistors R10 and R11 to the collector of the transistor 42 in the squelch level detecting circuit 15. The collectors of the transistors 45 and 46 form the output terminal 47 of the AND circuit 16. This output terminal 47 is connected to the base of the transistor 35 in the gate circuit 18 and to the input of the differentiation circuit 12. The differentiation circuit 12 has a transistor 48 so as to invert and differentiate an input signal.

Reference numeral 49 designates a light emission diode to indicate the narrow band signal reception state.

In the circuit shown in FIG. 3, the noise component contained in the FM demodulation signal is applied through the high-pass filter 8 to the automatic gain control amplifier 9, where it is amplified by the transistor 36 and 37, and it is rectified by the rectifier circuit 38. The rectified negative voltage is applied through the feedback circuit 39 to the base of the transistor 36. Therefore, when the level of the noise component is high, the base bias voltage of the transistor 36 is decreased and the DC collector current of the transistor 36 is reduced, with the result that the emitter potential is decreased. Accordingly, the base bias voltage of the transistor 40 in the switching level detecting circuit 10 is decreased, the collector current of the transistor 40 is decreased, and the collector voltage is increased, as a result of which the transistor 41 is rendered conductive. That is, the level of the trigger input terminal of the flip-flop circuit 14 is switched to the low level, and the transistor 30 in the flip-flop circuit 14 is rendered non-conductive, while the transistor 31 is rendered conductive. As a result, the transistor 29 in the band width switching circuit 5 is rendered conductive while the transistors 27 and 28 are rendered non-conductive; that is, since the path 26 is grounded, the signal from the amplifier 21 is applied through the path 25 to the amplifier 22, hence the narrow band signal reception state is selected.

In the case where the level of the noise component included in the demodulation signal is high as described above, the DC collector current of the transistor 36 in the automatic gain control amplifier 9 is small. Therefore, the voltage applied to the base of the transistor 42 in the squelch level detecting circuit 15 is high, and the transistor 42 is not in a sufficiently conductive state. Accordingly, the current applied to the transistors 43 and 44 in the DC component detector 11 is small, and the collector potentials of these transistors 43 and 44 is low. Hence, the base potentials of the transistors 45 and 46 in the AND circuit 16 are low, with the result that at least one of the transistors in the AND circuit 16 is rendered conductive, and the voltage at the output terminal 47 of the and circuit 16 becomes high. Therefore, the transistor 35 in the gate circuit 18 is rendered conductive to block the transmission of the demodulation signal; that is, that muting state is obtained. In the narrow band signal reception state, current flows in the light emission diode 49. As a result, the light emission diode 49 emits light to indicate that the receiver is in the narrow band signal reception state.

When the tuning comes close to the tuning point and the noise component is decreased, the operations opposite to those described above are carried out, as a result of which the transistor 41 in the switching level detecting circuit 10 is rendered non-conductive and the trigger input terminal 32 of the flip-flop circuit 14 is not grounded. As a result, the flip-flop circuit 14 is now prepared to be controlled by the output of the differentiation circuit 12. In other words, it is controlled by the signal from the AND circuit 16 to maintain the narrow band signal reception state or to switch the reception state to the broad band signal reception. As a result of the decrease of the noise component as described above, the collector current of the transistor 36 in the automatic gain control amplifier 9 is increased. Therefore, the base voltage of the transistor 42 in the squelch level detecting circuit 15 is decreased, and the collector current of the transistor 42, that is, the current supplied to the transistors 43 and 44 in the DC component detector 11 is increased, with the result that the voltage applied to the bases of the transistors 45 and 46 in the AND circuit 16 tends to increase. However, in the case where the tuning point is not completely obtained, the mid-point potential of the demodulation signal is deviated from the zero level, and therefore the collector potentials of the transistors 43 and 44 in the DC component detector 11 are different from each other. Accordingly, the base potential of one of the transistors 45 and 46 in the AND circuit 16 is lower than that of the other; for instance, the base potential of the transistor 45 is lower than that of the transistor 46. Accordingly, as the transistor 45 is conductive, the potential of the output terminal 47 of the AND circuit 16 is at the high level. Therefore, the output of the differentiation circuit 12 is maintained at the low level. Accordingly, the state of the flip-flop circuit 14 is not inverted. That is, the narrow band signal reception state is maintained. In this state, the transistor 35 of the gate circuit 18 is maintained conductive, that is, the muting state is maintained.

When the tuning point is completely obtained, the mid-point potential of the demodulation signal has the zero level, and therefore the base potentials of the transistors 43 and 44 in the DC component detector 11 become equal to each other. As a result, the collector potentials of these transistors 43 and 44, and accordingly the base potentials of the transistors 45 and 46 in the AND circuit 16 become equal to each other. This means that the base potential of the transistor 45 in the AND circuit 16 is raised although it was low before. Therefore, the transistor 45 is rendered non-conductive. On the other hand, the transistor 46 in the AND circuit 16 has been maintained non-conductive. In consequence, both of the transistors 45 and 46 are in non-conductive state. Therefore, the potential at the output terminal 47 of the AND circuit 16 is decreased. This potential variation is inverted and differentiated into a high level signal by the differentiation circuit 12, which is applied to the trigger input terminal 32 of the flip-flop circuit 14. As a result, one transistor 30 of the flip-flop circuit 14 is rendered conductive, while the other transistor 31 is rendered non-conductive. Therefore, while the collector potential of the transistor 30 is decreased, the collector potential of the transistor 31 is increased, as a result of which the transistor 29 in the band width switching circuit 5 is rendered non-conductive and the transistors 27 and 28 are rendered conductive. In other words, the path 25 is grounded, while the path 26 is not grounded. Therefore, the signal from the amplifier 21 in the intermediate-frequency amplifier stage 3 is applied through the path 26 to the amplifier 22. Thus, the broad band signal reception state is obtained. Furthermore, as the potential at the output terminal 47 of the AND circuit 16 has the low level as described above, the transistor 35 in the gate circuit 18 is rendered non-conductive, and therefore the signal from the demodulator 4 is delivered to the tuner output terminal 17. Thus, the muting state is canceled.

If the tuning has been completely obtained and, however, the level of the noise or interference signal at this tuning point is higher than the predetermined value, i.e. if the noise level is higher than the detection level of the switching level detecting circuit 10 and lower than the detection level of the squelch level detecting circuit 15, the potential of the trigger input terminal of the flip-flop circuit 14 is maintained to the low level, and the state of the flip-flop circuit 14 cannot be changed. Therefore, the narrow band signal reception state is maintained, and the output of the AND circuit 16 is switched to the low level. Thus, the muting state is canceled.

In the case when the noise or interference signal is increased to be higher than the detection level of the circuit 10 and lower than the detection level of the circuit 15 due to the fact that the narrow band signal reception is switched over to the broad band signal reception after the complete tuning has been obtained, the transistor 41 of the switching level detecting circuit 10 in the first detector 6 is rendered conductive as described before. Therefore, the state of the flip-flop 14 is inverted again and the broad band signal reception is changed to the narrow band signal reception, while the cancellation of the muting state is maintained.

As is apparent from the above description, during the station selecting operation the circuit is switched over to the narrow band width reception because the level of the noise component contained in the signal from the demodulator is large. When the tuning is obtained (in the second embodiment, when the tuning is obtained and the noise component level is low) it is switched over to the broad band width reception. Moreover, when in the broad band signal reception state the noise or interference signal level is increased and the noise component contained in the FM demodulation signal is increased, it is switched over to the narrow band width reception again. Thus, according to the circuit of this invention, the station selection can be readily achieved, and the signal receiving band width is automatically set to the optimum one according to the conditions of the noise or interference signal contained in the input radio wave. Therefore, the FM broadcast can be received in the most suitable state at all times. In addition, the troublesome operation that the band width is manually changed can be eliminated. In general, when the signal modulation factor of a near-by station is small or the signal thereof is not modulated, the signal reception of an FM radio receiver is not interfered by the signal of the near-by station. However, when the signal of the near-by station is greatly modulated, it may become an interference signal for the aimed station. Therefore, if preference is not given to the narrow band reception the signal receiving band width of the receiver is changed by variations in modulation factor of the signal of the near-by station even when the tuning is obtained. As a result, stable signal reception may not be maintained. However, in the circuit according to the invention, preference is given to the narrow band reception, and the narrow band is switched over to the broad band only when the tuning condition detection signal is obtained. Therefore, when in the tuning state a near-by station is present and the narrow band signal reception state is obtained, the band width is not switched by variations in modulation factor of the near-by station. Thus, the stable signal reception can be maintained at all times.

What is claimed is:

1. A reception condition selection device for an FM receiver, comprising: means for changing a signal receiving frequency band width of said receiver; a first detector for detecting a noise component in a demodulation signal from a demodulator in said receiver and producing a first signal when said noise component is higher than a first detection level; a second detector for detecting a tuning condition of said receiver and producing an output signal when the receiver is tuned; means for generating a second signal in accordance with said second detector output signal; bistable circuit means responsive to said first signal for switching said band width changing means to a signal reception of a first band width and responsive to said second signal for switching the band width changing means to a signal reception of a second band width which is broader than said first band width; and a third detector for detecting the noise component in said demodulation signal and producing a third signal when said noise component is lower than a second detection level which is higher than said first detection level, said second signal generating means including a logical circuit producing said second signal in response to the existence of both said third signal and said second detector output signal.

2. The device as claimed in claim 1, in which said second signal generating means further includes a differentiating circuit receptive an output signal of said logical circuit for producing said second signal through differentiation of said logical circuit output signal.

3. The device as claimed in claim 1, further comprising a gate circuit connected in a signal path in said receiver for transmitting the demodulation signal to an output of the receiver and having a control input receptive an output signal of said logical circuit for rendering said gate circuit open for transmission of said demodulation signal to the output of said receiver.

4. The device as claimed in claim 1 in which said bistable circuit means has a preference characteristic to respond to said first signal in preference to said second signal.

5. The device as claimed in claim 1 in which said second detector comprises a circuit for detecting a DC component in the demodulation signal of said receiver and producing said second detector output signal in the absence of said DC component.

* * * * *